(12) United States Patent
Roh et al.

(10) Patent No.: US 7,534,277 B2
(45) Date of Patent: May 19, 2009

(54) SLURRY COMPOSITION FOR SECONDARY POLISHING OF SILICON WAFER

(75) Inventors: Hyun Soo Roh, Kyoungi-Do (KR); Tae Won Park, Kyoungi-Do (KR); Kill Sung Lee, Kyoungi-Do (KR); In Kyung Lee, Kyoungi-Do (KR)

(73) Assignee: Cheil Industries, Inc., Gyeongsangbuk-Do (KR)

( * ) Notice: Subject to any disclaimer, the term of this patent is extended or adjusted under 35 U.S.C. 154(b) by 279 days.

(21) Appl. No.: 10/531,125

(22) PCT Filed: Jul. 30, 2003

(86) PCT No.: PCT/KR03/01532

§ 371 (c)(1),
(2), (4) Date: Apr. 13, 2006

(87) PCT Pub. No.: WO2004/053968

PCT Pub. Date: Jun. 24, 2004

(65) Prior Publication Data

US 2006/0242912 A1    Nov. 2, 2006

(30) Foreign Application Priority Data

Dec. 9, 2002    (KR) ................. 10-2002-0077860

(51) Int. Cl.
*C09G 1/02* (2006.01)
*C09G 1/04* (2006.01)

(52) U.S. Cl. ................ 51/308; 106/3; 106/5; 438/690; 438/691; 438/692; 438/693

(58) Field of Classification Search ............ 51/308; 106/3, 5; 438/690–692, 693
See application file for complete search history.

(56) References Cited

U.S. PATENT DOCUMENTS

| 3,715,842 A | 2/1973 | Tredinnick et al. |
| 4,169,337 A | 10/1979 | Payne |
| 4,462,188 A | 7/1984 | Payne |
| 4,588,421 A | 5/1986 | Payne |
| 5,352,277 A | 10/1994 | Sasaki |
| 2002/0173252 A1* | 11/2002 | Li ..................... 451/259 |
| 2003/0154659 A1* | 8/2003 | Xu et al. ................. 51/308 |
| 2003/0181349 A1* | 9/2003 | Maeno et al. ........... 510/499 |
| 2004/0147206 A1* | 7/2004 | Akahori et al. .......... 451/41 |

FOREIGN PATENT DOCUMENTS

| JP | 2000-006327 | 1/2000 |
| JP | 2001-3036 A | 1/2001 |
| JP | 2002-164308 A | 6/2002 |
| KR | 10-0289150 B1 | 2/2001 |
| KR | 2002-44587 A | 6/2002 |
| WO | WO 96/38262 A1 | 12/1996 |

* cited by examiner

*Primary Examiner*—Michael A Marcheschi
(74) *Attorney, Agent, or Firm*—Saliwanchik, Lloyd & Saliwanchik

(57) ABSTRACT

Disclosed is a slurry composition for secondary polishing of silicon wafers comprising: 2~10 weight % of colloidal silica having an average particle size of 30~80 nm; 0.5~1.5 % by weight of ammonia; 0.2~1 weight % of a hydroxyalkycellulose-based polymer for modifying rheology of the composition; 0.03~0.5 weight % of a polyoxyethylenealkylamine ether-based nonionic surfactant; 0.01~1 weight % of a quaternary ammonium base and the balance of deionized water.

6 Claims, No Drawings

SLURRY COMPOSITION FOR SECONDARY POLISHING OF SILICON WAFER

This application is a National Stage Application of International Number PCT/KR2003/01532, filed Jul. 30, 2003; which claims priority to Korean Application No. 2002-77860, filed Dec. 9, 2002.

TECHNICAL FIELD

The present invention relates to a slurry composition for secondary polishing of silicon wafers. More particularly, the present invention relates to a slurry composition which comprises a hydroxyalkylcellulose-based water-soluble polymeric thickener and a polyoxyethyleneallcylamine ether-based nonionic surfactant, thereby improving the dispersion stability of silica and thus considerably reducing the number of coarse particles (e.g. a particle size lager than several microns) in the slurry. When a CMP process is carried out using the slurry composition according to the present invention, the occurrence of microscratches can be reduced.

BACKGROUND ART

A CMP (chemical mechanical polishing) process is the final process in the fabrication of silicon wafers to lower the microroughness of wafer surface to planarize the wafer surface, and remove physical surface defects such as microscratches and pit marks. After the wafers are polished by the CMP process, they have a specular surface with low surface defects. Microscratches remaining on the wafer surface are defects that cause a problem during a photolithography process for implementing a circuit. Accordingly, it is important to reduce the number of the microscratches during the CMP process.

The CMP process for polishing wafers is normally carried out in two or more steps. The primary polishing step is a polishing step requiring a high polishing speed to remove deep scratches on the wafer surfaces. A secondary (final) polishing step is required to accomplish a specular surface by removing microscratches remaining after the primary polishing step and lowering the microroughness of the surface to the level of several Å.

In addition to a polisher and deionized water, the following two elements are required for polishing of the wafer surface: a soft or hard urethane polishing pad, and a silica slurry as a polishing solution. The wafer surface polishing process is explained based on a chemical mechanical polishing reaction. The polishing pad effects the mechanical polishing, while the polishing solution (slurry) effects the chemical polishing. The polishing solution also plays a role in assisting the mechanical polishing by the polishing pad. Demands for large diameter wafers and high quality wafers require improved performance of the polishing pad and the slurry. Particularly, since the slurry is considered to be a final regulator for high quality wafers, slurry products having various physicochemical properties are now commercially available in the market and studies on them are being actively undertaken.

The slurry used in the CMP process generally consists of an abrasive, a base as a pH-adjusting agent and deionized water. In addition, the slurry may further comprise an organic or inorganic additive depending on special intended polishing quality.

Silica is mainly used as the abrasive, and potassium hydroxide, sodium hydroxide, or aqueous ammonia is commonly used as the pH-adjusting agent. Examples of the additives for increasing polishing speed, cleanness of the surface to be polished and dispersibility of the abrasive include nonionic surfactants, polishing speed enhancers such as amines, etc.

It is common to employ different slurries depending on the characteristics of each CMP process. The primary polishing slurry and the second polishing slurry have different physical properties in order to increase the characteristics of each step. The first polishing slurry for increasing the polishing speed comprises an abrasive having a large particle size (80~120 nm) and a high concentration (2~30 wt %) and is adjusted to a pH of 11~12, thereby improving mechanical and chemical polishing force. On the other hand, the second polishing slurry for removing surface defects instead of increasing the polishing speed comprises an abrasive having a small particle size (10~80 nm) and a low concentration (0.2~10 wt %), thereby decreasing the mechanical polishing effect but increasing the chemical polishing effect. Various functional additives may further be added to the secondary polishing slurry for realizing a smooth specular surface.

Trednnick et al. (U.S. Pat. No. 3,715,842) discloses a method for producing a final polishing slurry comprising the steps of dispersing silica particles having a particle size of less than 100 nm in water, adding 0.05% by weight or more of ammonia to the dispersion to adjust the pH to 7 or higher, and adding 0.05~2.5% by weight of hydroxymethylcellulose (HMC), hydroxyethylcellulose (HEC) and hydroxypropylcellulose (HPC) thereto, thereby preventing the precipitation of the silica particles and reducing scratches.

Payne et al. U.S. Pat. Nos. 4,169,337, 4,462,188 and 4,588,421) describes compositions for increasing the polishing speed which comprises silica particles having a particle size of 4~100 nm, and 2~4% by weight of an amine selected from aminoethanolamine and ethylenediamine or 2~4% by weight of a quaternary ammonium salt selected from tetramethylammonium chloride or tetramethylammonium hydroxide (TMAH).

Sasaki et al. (U.S. Pat. No. 5,352,277) suggests a polishing slurry comprising colloidal silica, a water-soluble polymer and a water-soluble salt. The colloidal silica comprises 20 to 50% by weight of silica with a particle size of 5~500 nm, the water-soluble polymer is present at a concentration of about 100 ppm, and the water-soluble salt is present at a concentration of about 20~100 ppm and consists of a cation selected from Na, K and $NH_4$ and an anion selected from Cl, F, $NO_3$ and $ClO_4$. This slurry can realize a soft surface having a low surface roughness of less than 5 nm.

Lonckid et al. (WO 96/38262) suggests a slurry composition for final polishing of silicon wafers which comprises 0.2~0.5% by weight of silica having a particle size of several hundred nanometers or less, 0.01~0.1% by weight of an amine, and 0.02~0.05% by weight of PVA (polyvinyl alcohol). The amine is used to adjust the pH of the slurry at pH 8~11. It was observed that when a 150 mm wafer was polished using the slurry, the haze was 0.06 ppm and the LPDs (Line Point Defects) having a size of 0.1~0.3 microns were less than 90. However, nothing was taught about the other defects in this international publication.

Japanese Patent Application No. 2000-6327 of Inoue et al. discloses a composition for a secondary or a final polishing. In the composition, silica having a particle size of 20~300 nm is used as an abrasive and 0.001~0.3% by weight of TMAH is used as a base. In addition, this patent application discloses the addition of hydroxyethylcellulose (HEC) having a molecular weight of 1,300,000 or more for improving the surface hydrophilicity of the polished wafers. However, the composition obtained has not been satisfactory compared as common polishing slurries.

Recently, there is a need for high quality slurries in view of microroughness and pitted microscratches, as well as surface defects such as haze and LPDs (Low Point Defects). In particular, since pitted microscratches tend to arise due to unbalanced chemical polishing by a polishing slurry, considerable care is required during mixing the slurry.

The present inventors have conducted an intensive study to find out a slurry composition capable of increasing the dispersion stability of silica as an abrasive to improve the polishing quality on pitted microscratches and reducing the amount of silica particles in the composition to lower the manufacturing cost. As a result, the inventors have found a slurry composition with low concentration of silica and high dispersibility.

DISCLOSURE OF THE INVENTION

In accordance with the present invention, there is provided a slurry composition for secondary polishing of semiconductor wafers which comprises 2~10% by weight of colloidal silica having an average particle diameter of 30~80 nm as an abrasive, 0.5~1.5% by weight of ammonia, 0.2~1% by weight of a hydroxyalkylcellulose-based water-soluble polymeric thickener, 0.03~0.5% by weight of a polyoxyethylenealkylamine ether-based nonionic surfactant, 0.01~1% by weight of a quaternary ammonium base and the balance of deionized water.

Hereinafter, the present invention will now be explained in detail.

The slurry composition of the present invention comprises deionized water, a silica abrasive, ammonia, a hydroxyalkylcellulose-based water-soluble polymeric thickener, a polyoxyethylenealkylamine ether-based nonionic surfactant, and a quaternary ammonium base.

To reduce mechanical polishing effect, colloidal silica having an average particle diameter of 30~80 nm is used as the silica abrasive. If the average particle diameter is less than 30 nm, sufficient mechanical polishing effect is not obtained and there may be a risk of instability of particles due to polishing remnants such as siloxane substituents during polishing. The instability of silica particles due to polishing remnants results in remaining LPDs (Light Point Defects) on the wafer surface, which is a cause of poor wafer quality. When the average particle diameter exceeds 80 nm, the polishing speed is high, but damages to the wafer surface or subsurface occur, which is not suitable for a final polishing slurry.

In particular, it is preferred in terms of high polishing quality that a first particle diameter of the colloidal silica is within the range of 35~50 nm and a second particle diameter of the colloidal silica is within the range of 60~80 nm. When the agglomerate ratio, that is, the ratio of the first particle diameter to the second particle diameter, is between 1.6 and 1.8, the above-mentioned effect can be obtained.

The concentration of the silica in the composition is preferably within the range of 2~10% by weight, and more preferably 4~6% by weight. Since the second particle having a relatively large diameter increases the polishing speed, the silica may be maintained at low concentration to adjust the final polishing speed at 0.5~1µm/min. In addition, the low concentration of the silica improves the dispersion stability and the storage stability of the silica. This dispersion stability of the silica prevents the formation of coarse impurities inside the slurry, thereby reducing the occurrence of scratches, particularly, submicron scratches, and thus improving the polishing quality.

Ammonia, a weak base, is used as a pH-adjusting agent. In addition, the ammonia functions to increase the chemical dispersibility of the silica, and assist the chemical polishing activity during the CMP process. The ammonia is added in an amount of 0.5~1.5% by weight to adjust the pH of the slurry at 10.4~10.7.

The water-soluble polymeric thickener is added to further increase the dispersion stability of the silica particles. As the water-soluble polymeric thickener, water-soluble hydroxyallcylcellulose-based compounds are used. Examples of the hydroxyalkylcellulose-based compounds include hydroxypropylcellulose, hydroxybutylmethylcellulose, hydroxypropylmethylcellulose, hydroxyethylcellulose, lipophilically-modified hydroxyethylcellulose, hydroxymethylcellulose, methylcellulose and the like.

The hydroxyalkylcellulose-based compounds are stable at high temperature, and preferably have a clouding point of 50° C. or higher. In view of the foregoing, hydroxypropylcellulose, hydroxyethylcellulose and hydroxymethylcellulose are preferably used. These hydroxyalkylcellulose-based compounds have a weight average molecular weight of 100,000~1,500,000 so as to form a laminar flow and maintain the viscosity of the slurry at 7~80 cP, preferably 20~80 cP and more preferably 30~70 cP. The amount of the polymeric thickener added is within the range of 0.2~1% by weight.

Since the hydroxyalkylcellulose-based compounds form a three-dimensional network and delay the agglomeration or sedimentation of the silica, the dispersion stability of the silica is improved. In addition, since the hydroxyalkylcellulose-based compounds allow the silica abrasive to come into contact with the wafer surface in a regular orientation, they play an important role in implementing a soft specular wafer surface.

In order to realize a networked disperse phase of the thickener and a uniform disperse phase of the silica in the disperse phase between the silica and the thickener and maintain such disperse phases for a long time, a special physical or chemical treatment is required. For this purpose, the polyoxyethylenealkylamine ether-based nonionic surfactant is added, and then the resulting mixture is subjected to mechanical homogenization at a high shear stress, thereby the dispersion stability of the silica slurry composition is considerably improved.

The polyoxyethylenealklylamine ether-based nonionic surfactant is represented by the following formula 1:

$$RN(R'O)_m(R''O)_n \quad (1)$$

wherein R is an alkyl group having 1~3 carbon atoms, R' and R" are each independently ethylene or isopropylene group, m and n are each independently an integer of from 10 to 80, and m+n is within the range of 20~90.

The m+n refers to an additive molar number of oxyethylene and oxyisopropylene monomers, and is preferably within the range of 25~50 moles, and more preferably 30~40 moles. If the m+n is less than 20, the nonionic surfactant is ineffective in improving the dispersibility of the thickener and the composition. When the m+n exceeds 90, foamability is increased, causing poor workability and high viscosity of the composition.

The polyoxyethylenealkylamine ether-based nonionic surfactant is used in an amount of 0.03~0.5% by weight, based on the total weight of the composition. When the amount of the polyoxyethylenealkylamine ether is less than 0.03% by weight, a sufficient dispersion effect is not obtained. When the amount of the polyoxyethylenealkylamine ether exceeds 0.5% by weight, the dispersion stability becomes poor.

To increase polishing speed, it is advantageous to add quaternary ammonium base with 1~4 alkyl groups to the polishing composition. Specific examples of the quaternary ammonium base include tetramethylammonium hydroxide, tetraethylammonium hydroxide, trimethylethoxyammonium hydroxide and N,N-dimethylpiperidine hydroxide.

The amount of the quaternary ammonium base added is within the range of 0.01~1% by weight and preferably 0.05~0.7% by weight so as to adjust the pH value of the final composition at 10.4~10.7.

In the slurry composition of the present invention, the dispersion stability of the silica particles is improved and the formation of coarse particles is prevented. Accordingly, when the wafer surface is finally polished by the slurry composition according to the present invention, pitted microscratches and area scratches are decreased.

DETAILED DESCRIPTION OF PREFERRED EMBODIMENTS

The present invention will now be described further in detail with reference to the following Examples. However, these examples are not to be construed as limiting the scope of the invention.

In the following Examples, Rodel 2371 was used for primary polishing, and the slurry of the present invention was used for secondary and tertiary polishing. After each polishing, the polished surfaces were compared. The polished surfaces were analyzed with SURFSCAN SP-1 (KLA-TENCOR). Pitted microscratches having a size of 0.1 microns or more and area scratches were measured by the number of LPDs and area defects on the polished surface, respectively.

[Polishing conditions]
Polisher: STRAUGHBAUGH MARK9K
Table speed: 50 rpm
Head speed: 30 rpm
Flow rate of slurry: 0.5 L/min.
Pressure: 5 psi

EXAMPLE 1

Colloidal silica having a first average particle diameter of 40 nm and a second average particle diameter of 70 nm was diluted in deionized water to obtain 6% by weight of the silica content (based on the final composition), and then ammonia was added in an amount of 1% by weight (based on the final composition) thereto to adjust the pH value at 10.3~10.5. Tetramethoxyammonium hydroxide was used in an amount of 0.08% by weight (based on the final composition) as a quaternary ammonium base to adjust the pH value at 10.5~10.6. Hydroxyethylcellulose having an average molecular weight of 500,000 was added in an amount of 0.6% by weight (based on the final composition) as a thickener and tripolyoxyethyleneamine ether containing 30 moles of oxyethylene monomer was mixed in an amount of 0.1% by weight. The resulting mixture was stirred at 2,000 rpm using a homogenizer (manufactured by IKA) to prepare a slurry composition having a viscosity of 70 cP.

The resulting slurry composition was diluted ten-fold with deionized water, and then used as a secondary and a final polishing slurry. The diluted slurry was used to polish a p-type 200 mm flat wafer with (100)-orientation using a multihead polisher (manufactured by Speedfam Corp.) equipped with a hard urethane polishing pad. Scratches on the surfaces of 20 wafers were analyzed using SP1 (KLA-Tencor Corp.). Pitted microscratches having a size of 0.1 microns or more and area scratches were measured by the number of LPDs and area defects on the surface of the polished wafer, respectively. In average, 3 LPDs and 2 area defects were observed.

COMPARATIVE EXAMPLE 1

The slurry composition of Comparative Example 1 was prepared in the same manner as Example 1 except that no tripolyoxyethyleneamine ether was added. The pitted microscratches and area scratch of the resulting slurry composition were measured in the same manner as Example 1. In average, 10 LPDs and 10 area defects were observed.

EXAMPLE 2

Slurry compositions were prepared and evaluated in the same manner as in Example 1 except that the first and the second particle diameters of the colloidal silica were changed as shown in Table 1. The results are shown in Table 1.

TABLE 1

Comparison of polishing quality on various particle diameters and the agglomerate ratios of the abrasive

|  | First particle diameter | Second particle diameter | No. of LPD (ea) | Area defects (ea) | Polishing speed (μm/min.) |
|---|---|---|---|---|---|
| Example 2-1 | 20 | 40 | 15 | 4 | 0.82 |
| Example 2-2 | 40 | 70 | 5 | 2 | 0.98 |
| Example 2-3 | 40 | 100 | 7 | 15 | 1.0 |
| Example 2-4 | x | 120 | 7 | 16 | 1.2 |

It is clear from Example 2 that when the first particle diameter was 40 nm and the agglomerate ratio was 1.75, the polishing quality was uniform and excellent.

EXAMPLE 3

A slurry composition was prepared and evaluated in the same manner as in Example 1 except that the amount of the oxyethylene monomer added to the polyoxyethylenealkylamine ether was changed as shown in Table 2. The results are shown in Table 2.

TABLE 2

Comparison of physical properties and polishing quality by nonionic surfactant

|  | Nonionic Surfactant | Sedimentation ratio[1] (%) | Amount of coarse particles[2] (ppm) | No. of LPDs (ea) | Area defects (ea) |
|---|---|---|---|---|---|
| Example 3-1 | m + n = 5 | 3.8 | 260 | 12 | 5 |
| Example 3-2 | m + n = 35 | 2.5 | 72 | 8 | 1 |
| Example 3-3 | m + n = 50 | 2.2 | 61 | 5 | 2 |
| Example 3-4 | M + n = 75 | 2.0 | 170 | 2 | 2 |
| Example 3-5 | m + n = 100 | 5.3 | 1000 | 22 | 18 |
| Example 3-6 | Not added | 4.0 | 360 | 10 | 6 |

[1] Volume fraction of highly concentrated layer precipitated at the bottom to total volume of slurry (measured 3 days after preparation)
[2] Coarse impurities having a particle diameter of 3 microns or more It is apparent from Example 4 that when the total molar number of oxyethylene monomer contained in the nonionic surfactant was 50, the physical properties and polishing quality of the slurry composition were excellent.

COMPARATIVE EXAMPLE 2

Commercially available slurries having various first particle diameters, second particle diameters and viscosities as shown in Table 3 but the same silica content (6% by weight)

and pH (10.7) were diluted 10-fold with deionized water. Polishing procedure of the slurries was carried out in the same manner as in Example 1. The results are shown in Table 3 below.

TABLE 3

Comparison of polishing quality between the slurry of the present invention and commercially available slurries

| | First particle diameter (nm) | Second particle diameter (nm) | Viscosity (cP) | Sedimentation ratio (%) | Amount of coarse particles (ppm) | No. of LPD (ea) | Area defects (ea) | Polishing speed (μm/min.) |
|---|---|---|---|---|---|---|---|---|
| Example 2 | 40 | 70 | 72 | 2.5 | 72 | 5 | 2 | 0.98 |
| Comparative Example 8 | 30 | 65 | 30 | 0.2 | 700 | 18 | 4 | 0.97 |
| Comparative Example 9 | 45 | 80 | 60 | 4.5 | 2000 | 10 | 4 | 1.2 |

It can be seen from data shown in Table 3 that the slurry composition of the present invention achieves excellent physical properties in terms of dispersion stability and polishing quality, particularly measured by surface scratches, compared to the commercially available polishing slurries.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A slurry composition for secondary polishing of semiconductor wafers which comprises 2~10% by weight of colloidal silica having an average particle diameter of 30~80nm as an abrasive, 0.5~1 5% by weight of ammonia, 0.2~1% by weight of a hydroxyalkylcellulose-based water-soluble polymeric thickener, 0.03~0.5% by weight of a polyoxyethylene-alkylamine ether-based nonionic surfactant, 0.01~1% by weight of a quaternary ammonium base and the balance of deionized water, wherein the polyoxyethylenealkylamine ether is represented by the following formula 1:

$$RN(R'O)_m(R''O)_n \quad (1)$$

wherein R is an alkyl group having 1~3 carbon atoms, R' and R" are each independently an ethylene or isopropylene group, m and n are each independently an integer of from 10 to 80, and m+n is within the range of 20 to 90.

2. The slurry composition according to claim 1, wherein the colloidal silica has a first particle diameter of 35~50nm and a second particle diameter of 60~80nm.

3. The slurry composition according to claim 1, wherein the water-soluble polymeric thickener is hydroxypropylcellulose, hydroxybutylmethylcellulose, hydroxypropylmethylcellulose, hydroxyethylcellulose, lipophilically-modified hydroxyethylcellulose, hydroxymethylcellulose or methylcellulose, and has an average molecular weight of 100,000~1,500,000.

4. The slurry composition according to claim 1, wherein the water-soluble polymeric thickener maintains the viscosity of the slurry at 7~80 cP.

5. The slurry composition according to claim 1, wherein the quaternary ammonium base is tetramethyammonium hydroxide, tetraethylammonium hydroxide, trimethylethoxyammonium hydroxide or N,N-dimethylpiperidine hydroxide.

6. The slurry composition according to claim 1, wherein R' and R" are each independently an isopropylene group.

* * * * *

UNITED STATES PATENT AND TRADEMARK OFFICE
CERTIFICATE OF CORRECTION

PATENT NO. : 7,534,277 B2
APPLICATION NO. : 10/531125
DATED : April 13, 2005
INVENTOR(S) : Hyun Soo Roh et al.

It is certified that error appears in the above-identified patent and that said Letters Patent is hereby corrected as shown below:

Column 1
Lines 6-7 "2002-77860" should read --10-2002-77860--

Column 1
Line 15 "polyoxyethyleneallcylamine" should read --polyoxyethylenealkylamine--

Column 2
Line 47 "Lonckid et al." should read --Loncki *et al.*--

Column 4
Lines 7-8 "hydroxyallcylcellulose-based" should read --hydroxyalkylcellulose-based--

Column 8
Line 39, Claim 5 "tetramethyammonium hydroxide" should read
--tetramethylammonium hydroxide--

Signed and Sealed this

Twenty-eighth Day of July, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,534,277 B2  Page 1 of 1
APPLICATION NO. : 10/531125
DATED : May 19, 2009
INVENTOR(S) : Hyun Soo Roh et al.

It is certified that error appears in the above-identified patent and that said Letters Patent is hereby corrected as shown below:

Column 1
Lines 6-7 "2002-77860" should read --10-2002-77860--

Column 1
Line 15 "polyoxyethyleneallcylamine" should read --polyoxyethylenealkylamine--

Column 2
Line 47 "Lonckid et al." should read --Loncki *et al.*--

Column 4
Lines 7-8 "hydroxyallcylcellulose-based" should read --hydroxyalkylcellulose-based--

Column 8
Line 39, Claim 5 "tetramethyammonium hydroxide" should read --tetramethylammonium hydroxide--

This certificate supersedes the Certificate of Correction issued July 28, 2009.

Signed and Sealed this

Twenty-ninth Day of September, 2009

David J. Kappos
*Director of the United States Patent and Trademark Office*